(12) United States Patent
Ip et al.

(10) Patent No.: US 7,237,208 B1
(45) Date of Patent: Jun. 26, 2007

(54) MANAGING FORMAL VERIFICATION COMPLEXITY OF DESIGNS WITH DATAPATHS

(75) Inventors: Chung-Wah N. Ip, Fremont, CA (US); Lawrence Loh, Milpitas, CA (US); Howard Wong-Toi, Albany, CA (US); Harry D. Foster, Plano, TX (US)

(73) Assignee: Jasper Design Automation, Inc., Mountain View, CA (US)

( * ) Notice: Subject to any disclaimer, the term of this patent is extended or adjusted under 35 U.S.C. 154(b) by 180 days.

(21) Appl. No.: 10/818,711

(22) Filed: Apr. 5, 2004

(51) Int. Cl.
*G06F 17/50* (2006.01)

(52) U.S. Cl. .................. 716/4; 716/1; 716/18
(58) Field of Classification Search ............. 716/1–18
See application file for complete search history.

(56) References Cited

U.S. PATENT DOCUMENTS

| | | | |
|---|---|---|---|
| 5,086,477 A * | 2/1992 | Yu et al. ................. | 382/145 |
| 5,271,000 A * | 12/1993 | Engbersen et al. ......... | 370/244 |
| 5,519,627 A * | 5/1996 | Mahmood et al. .......... | 716/18 |
| 5,537,580 A * | 7/1996 | Giomi et al. ............. | 716/19 |
| 5,764,525 A * | 6/1998 | Mahmood et al. .......... | 716/18 |
| 6,591,403 B1 | 7/2003 | Bass et al. | |
| 2005/0114809 A1 * | 5/2005 | Lu ..................... | 716/5 |

OTHER PUBLICATIONS

Paruthi et al., Automatic data path abstraction for verification of large scale designs, Oct. 1998, IEEE, pp. 192-194.*
Macii et al. Formal Verification of Digital System by Automatic Reduction of Data Paths, Oct. 1997, IEEE, vol. 16, No. 10 pp. 1136-1156.*
The Abstract, Morihiro et al. Formal verification of data-path circuits based on symbolic simulation, Dec. 2000, IEEE.*
Bening, L. and Foster, H., Principles of Verifiable RTL Design, Second Edition, Kluwer Academic Publishers, Boston, 2001, pp. 44-68.

\* cited by examiner

*Primary Examiner*—Jack Chiang
*Assistant Examiner*—Nghia M. Doan
(74) *Attorney, Agent, or Firm*—Fenwick & West LLP

(57) ABSTRACT

To perform functional verification of a digital design that includes one or more datapaths, a formal verification system includes a datapath abstraction tool. The datapath abstraction tool detects a datapath in a circuit design and performs an appropriate abstraction of the datapath. The tool may also deduce datapath elements from identified ones as well as link the abstractions of particular datapath elements. The abstraction tool then passes the circuit design with the abstraction to the verification software to simplifying the formal verification process.

15 Claims, 4 Drawing Sheets

MANAGING FORMAL VERIFICATION COMPLEXITY OF DESIGNS WITH DATAPATHS

BACKGROUND

1. Field of the Invention

This invention relates generally to the field of functional verification of digital designs with respect to a set of requirements, and specifically to the formal verification of designs that have one or more datapaths.

2. Background of the Invention

Over the last 30 years, the complexity of integrated circuits has increased greatly. This increase in complexity has exacerbated the difficulty of verifying circuit designs. In a typical integrated circuit design process, which includes many steps, the verification step consumes approximately 70–80% of the total time and resources. Aspects of the circuit design such as time-to-market and profit margin greatly depend on the verification step. As a result, flaws in the design that are not found during the verification step can have significant economic impact by increasing time-to-market and reducing profit margins. To maximize profit, therefore, the techniques used for verification should be as efficient as possible.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical design tools to create a HDL-based design.

In the design flow, creation of the RTL source code is followed by verification of the design to check if the RTL source code meets various design specifications. This verification is performed by simulation of the RTL code using a "testbench," which includes stimulus generators and requirement monitors. The verification method involving the use of RTL source code and testbench is referred to as the simulation process. For a circuit having n inputs, there would be $2^n$ possible combinations of inputs at any given time. Where n is large, such as for a complex design, the number of possible input sequences becomes prohibitively large for verification. To simplify the verification process, therefore, only a subset of all possible inputs is described in a particular testbench.

The increasing complexity of circuit designs has lead to several drawbacks associated with simulation-based techniques. Reasons for these drawbacks include the requirement of a large amount of time to verify circuit designs, the use of a large amount of resources and thus large costs, and the inability to verify large designs completely and quickly. For large and complex designs in which many combinations of inputs are possible, therefore, the simulation process is not reliable. This is because the simulation process verifies the circuit only for a subset of inputs described in the testbench; thus, circuit behavior for all possible combinations of inputs is not checked.

An increasingly popular alternative is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. Since mathematical properties define the design requirements in pure mathematical terms, this enables analysis of all possible valid inputs for a given circuit and is akin to an exhaustive simulation. Formal verification methods are therefore more exhaustive when compared to simulation methods. Moreover, formal verification methods provide many advantages over the simulation methods, such as reduced validation time, quicker time-to-market, reduced costs, and high reliability.

Performance limits and resource availability inhibit the widespread use of model checking. The resources required to perform verification are typically exponentially related to the number of registers in the circuit model, as well as other characteristics. This is referred to as the "state space explosion" problem. Many conventional model checkers analyze the entire design before proving a particular property, verifying the behavior of the design with all possible inputs at all times. These model checking techniques thus rely on an underlying reachability analysis and must iterate through time to collect all possible states into a data structure. But the complexity and size of modern integrated circuits, combined with the state space explosion problem, make it impossible to use conventional model checkers on complex designs.

Moreover, functional formal verification tools often encounter capability limitations, which in many cases are due to the need to process an increased state-space encountered by circuit designs that contain datapaths. Today, digital designs commonly include a combination of control logic and datapath circuits. Functional formal verification schemes using theorem proving, model checking, or other techniques are limited in their ability to verify designs that contain datapath circuits. Therefore, the successful application of functional formal verification on designs that contain datapath logic has historically required significant manual abstraction of the datapath circuits in the design. A process of applying manual abstractions to circuit designs with datapaths typically includes: (1) manually inspecting the design architecture to discover possible datapath abstractions; (2) manually altering the original design model to include an abstract model of the datapath circuit; and (3) performing functional formal verification on the abstract model. These manual abstractions are typically performed by an expert with significant background in formal verification and abstraction techniques, which are not well understood by designer or verification engineers. Specific techniques have been proposed to automate a portion of this abstraction process, but functional formal verification of designs that contain datapath logic in an industrial setting has not reached mainstream acceptance because of the limitations of these techniques. Accordingly, a need remains for simplifying the verification of designs that have datapaths without having the limitations of existing formal verification methods.

SUMMARY OF THE INVENTION

To enable reliable verification of circuit designs that use datapaths, the invention provides methods, systems, and computer-readable media for simplifying datapaths in a circuit design and thus managing the complexity of the formal verification process of designs that use such datapath elements. This is achieved by detecting datapath elements within a circuit design and replacing those datapath elements with an appropriate abstraction model. By using the abstraction for the datapath rather than the code in the circuit design that implements it, the formal verification process can be greatly simplified. To improve the benefits of abstracting datapath elements in the design, the identified datapath elements may be used to deduce additional datapath elements in the design. In addition, or in the alternative, the abstractions for the datapath elements may be linked to the input of the design so their constraints can be applied throughout the design.

In one embodiment, a computer-implemented method or a computer program product performs formal verification of a circuit design that includes a plurality of datapath elements. A first datapath element is detected in the circuit design and is then replaced with a first abstraction. Using the detected first datapath element, a second datapath element is located in the circuit design, and the second datapath element is replaced with a second abstraction. The circuit design, with the first and second abstractions, is passed to a formal verification system for verifying the desired properties of the design.

In another embodiment, a computer-implemented method or a computer program product performs formal verification of a circuit design that includes at least one datapath. A datapath element is detected in the circuit design, and the datapath element is replaced with an abstraction that applies a constraint relating an incoming signal of the detected datapath element to an output of the datapath element. The abstraction of the datapath element is then linked so that the constraint applies to an input of the circuit design. The circuit design, with the linked abstraction, is passed to a formal verification system for verifying the desired properties of the design.

DETAILED DESCRIPTION OF THE PREFERRED EMBODIMENTS

To perform functional verification of a digital design that includes one or more datapaths, a formal verification system includes a datapath abstraction tool. The datapath abstraction tool is used for automatically managing the formal verification complexity of designs that contain a datapath. Examples of datapaths that are commonly found in circuit designs include, but are not limited to, FIFO (first-in-first-out) elements, LIFO (last-in-first-out) elements, standard memories, caches, and context-addressable memories. The datapath abstraction tool detects a datapath in a circuit design and automatically performs an appropriate abstraction of the datapath. The abstraction tool then passes the circuit design to the verification software, which uses the abstraction for the datapath rather than the code in the circuit design that implements it, thereby simplifying—or even making possible—the verification process.

Figure 1:
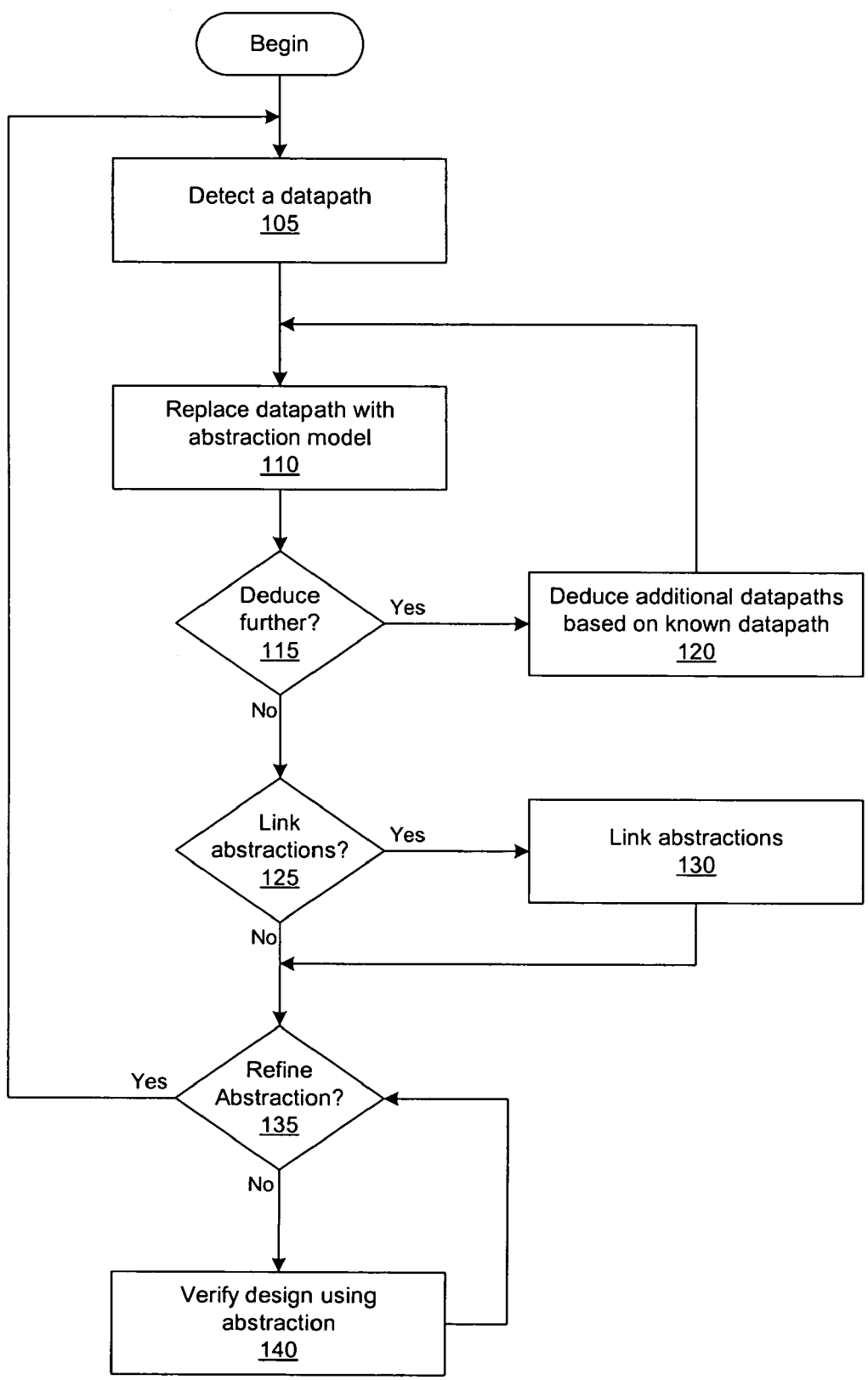
FIG. 1 is a flow chart showing the operation of a formal verification system with a datapath abstraction tool, in accordance with an embodiment of the invention.

FIG. 1 illustrates the operation of a formal verification system with a datapath abstraction tool, in accordance with an embodiment of the invention. The datapath abstraction tool analyzes a circuit design to detect 105 a datapath in the design. This detection can be performed in a number of ways, including through structural analysis of the design, by identification of datapath components from a library, or through manual identification by the user, each of which is described in more detail below. Once a datapath is detected, the abstraction tool replaces 110 the datapath with an abstraction model for that datapath, which is used during formal verification of the circuit design. Beneficially, the abstraction for the datapath includes a fewer number of states for the verification system to check during the formal verification process. The detection 105 and replacement 110 processes may be performed automatically by the verification system, or they may be directed by a user.

Once the abstraction tool performs the abstraction described above, the tool may further refine the abstraction for the circuit design in a number of ways. For example, if 115 the abstraction tool is configured to deduce additional datapaths, the tool will use a known datapath in the circuit to deduce 120 the existence of additional datapaths. This deduction takes advantage of the observation that datapath circuits tend to be connected to other datapath circuits in a digital circuit design. In addition, this technique may be preferable over other methods of datapath detection, which usually require more resources. Additionally, if 125 the tool is configured to link abstractions, the tool will link 130 one or more identified abstractions to an input of the circuit. If 135 further refinement of the abstraction model of the circuit design is desired, the tool may iterate through this process multiple times until the abstraction model for the circuit design is sufficiently abstracted. Thereafter, the abstraction model is used to verify 140 the circuit design by a formal verification system. If verification is not possible, the system may attempt to refine the abstraction and retry the verification until successful.

Systems for performing formal verification, in which the datapath abstraction tool described herein can be implemented, are described in co-pending U.S. application Ser. No. 10/606,419, filed Jun. 26, 2003, entitled "Method and Apparatus for Guiding Formal Verification for Circuit Design," and co-pending U.S. application Ser. No. 10/389,316, filed Mar. 14, 2003, entitled "Method for Verifying Properties of a Circuit Model," both of which are fully incorporated by reference herein. These example formal verification systems are cited for illustration purposes, as the datapath abstraction techniques described herein can be applied generally to any formal verification process used on circuit designs with datapaths or similar circuitry.

As described above, the datapath abstraction tool detects a datapath circuit in the circuit design. In one embodiment, this detection is performed through structural analysis of the circuit design. Based on heuristics derived from observations about the structure and operation of typical datapath circuits, the abstraction tool can detect a uniquely coded datapath circuit that is modeled, for example, using a synthesizable hardware description language (such as Verilog or VHDL RTL model). The tool may perform the structural analysis of the circuit design by reviewing the register-transfer-level (RTL) description of the design or a high-level abstraction model (e.g., a requirements model) of the design.

Figure 2A:
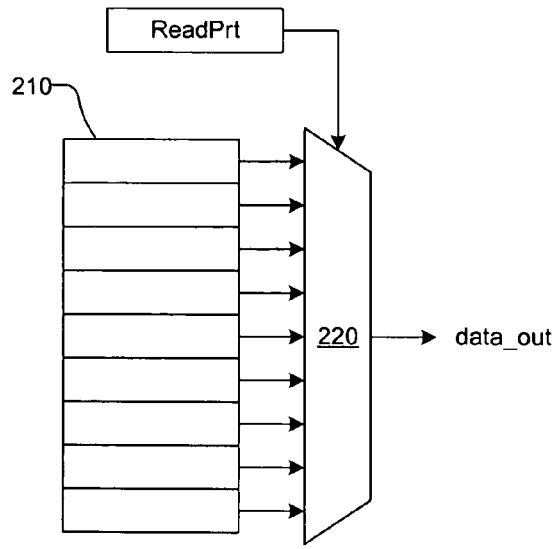
FIGS. 2A through 2C illustrate example datapath circuits that might be found in a typical digital circuit design.

FIG. 2A illustrates an example of an output or read multiplexer 220 coupled to a memory 210, which is common for a FIFO and other types of datapath circuits. A set of equations can be derived that relate the control signal of the multiplexer 220, ReadPrt, to the output of the multiplexer 220, data_out, as follows:

(ReadPrt == 0) => (data_out == m[0])
(ReadPrt == 1) => (data_out == m[1])
(ReadPrt == 2) => (data_out == m[2])
. . .
(ReadPrt == n−1) => (data_out == m[n−1])

It can be appreciated that these equations are disjoint, or mutually exclusive, as only one of the conditions can be true at any time. This leads to an observation about such a datapath circuit, which can be applied to detect datapaths in a circuit design: If the set of equations that relate the control and the output of a multiplexer are disjoint, then the circuit's output behavior is structurally is similar to a datapath, such as the output of a memory element or a FIFO. Whether the equations are disjoint is easily determined though analysis of various data structures, such as binary decision diagrams, and is well known in the art.

Figure 2B:
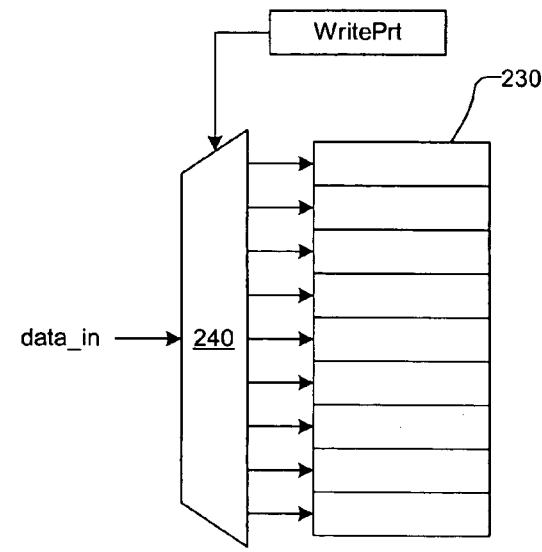

A similar technique of structural analysis can be applied to identify a datapath circuit associated with an input or write demultiplexer. FIG. 2B illustrates an example of a demultiplexer 240 coupled to a memory 230. As with the multiplexer 220 of FIG. 2A, a set of equations can be written that relate the control signal of the demultiplexer 240, WritePrt, to the input of the demultiplexer 240, data_in, as follows:

(WritePrt == 0) => (m[0] == data_in)
(WritePrt == 1) => (m[1] == data_in)
(WritePrt == 2) => (m[2] == data_in)
. . .
(WritePrt == n−1) => (m[n−1] == data_in)

Figure 2C:
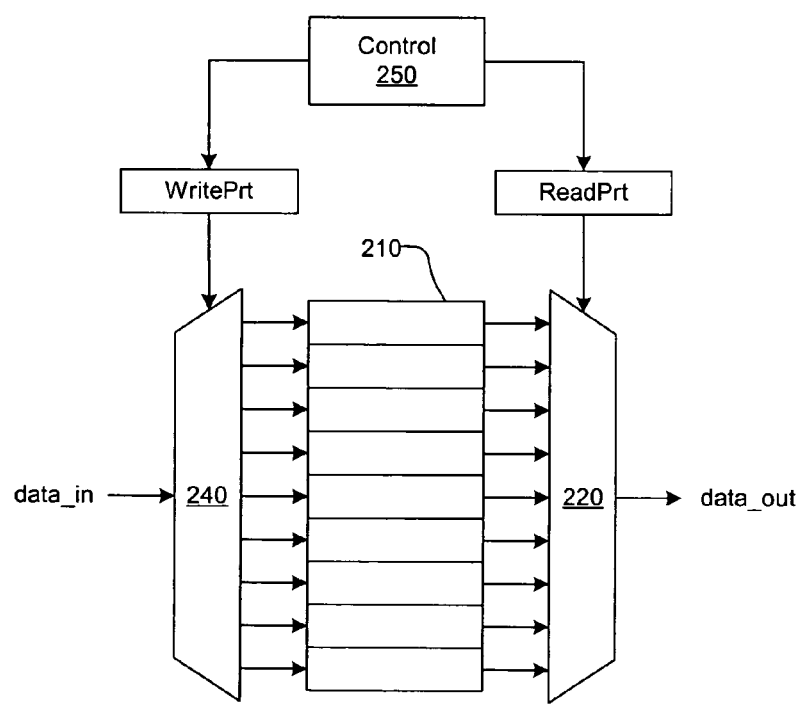

If the set of equations that relate the control and the input of the demultiplexer 240 are disjoint, then the circuit's output behavior is structurally similar to a datapath. In this case, the datapath may be the input for a memory element or a FIFO. FIG. 2C shows a circuit diagram combining the circuits of FIGS. 2A and 2B. By driving the control signals for the multiplexer 220 and demultiplexer 240 with control logic 250, this circuit may implement a FIFO, LIFO, or another type of datapath circuit that passes data therethrough. The techniques described above may be used to identify this circuit as a likely datapath, either by analyzing the output of the multiplexer 220 or the input of the demultiplexer 240. While the examples of FIGS. 2A through 2C are shown, they do not limit the types of datapath circuits that can be detected by structural analysis.

While these techniques provide heuristic methods to detect datapaths in a circuit design, the detection of a datapath is not limited to these basic structural analysis techniques or the equations provided above. For example, the input or output equations might involve other control signals, such as a write or read enable signal, or potentially other circuit enable control signals. Regardless of the variations of control signals, however, the tool may detect a datapath based on whether the set of data input or output equations are disjoint. Other tests for automatically detecting a datapath may comprise these and other heuristics based upon empirical knowledge about the typical design and operation of datapaths. They can be performed alone or in combination with additional tests, or a completely different set of tests could be used to detect datapaths. Moreover, these tests can evolve as the typical designs of circuits evolve.

Figure 3:
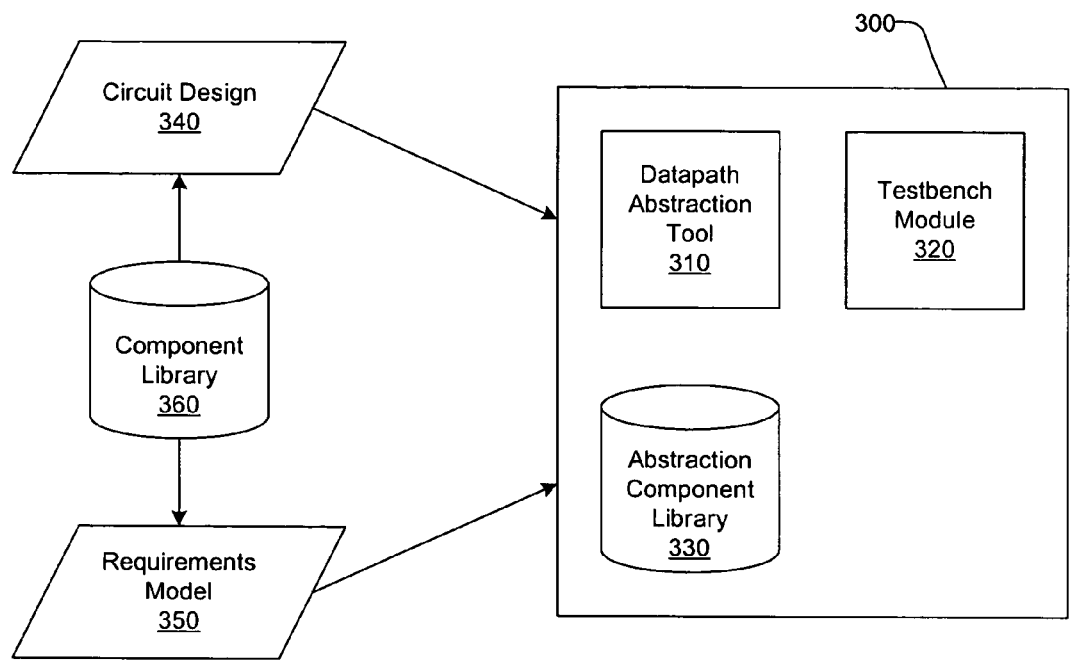
FIG. 3 shows a formal verification system with an abstraction library, in accordance with an embodiment of the invention.

In another embodiment, the abstraction tool detects a datapath circuit in a circuit design by detecting a specific datapath library component instantiated in an RTL model of the design. This technique may be used as an alternative to directly detecting datapath structures coded in a synthesizable register-transfer-level (RTL) description, or it may be used in addition to the structural analysis techniques. FIG. 3 shows a formal verification system 300 that includes a datapath abstraction tool 310, an abstraction component library 330, and a testbench module 320 for performing verification on an abstracted circuit model. Using libraries of components allows the abstraction tool 310 to detect datapath components in a circuit design more reliably and with relatively fewer resources, so this technique can be substantially less demanding than a structural analysis of the circuit design.

To use library components in the design, the user selects a pre-coded datapath component from a component library 360 of datapath models. This pre-coded model is instantiated into either the user's circuit design 340 (e.g., at the RTL code level) or in the requirements model 350. This enables the user to quickly develop code that has a particular datapath behavior in the model. The instantiated datapath component contains all the details for the user to simulate the datapath behavior when instantiated in the design. In addition, when the circuit design 340 and/or requirements model 350 are passed to the formal verification system 300, the datapath abstraction tool 310 automatically detects the instantiated library datapath component. Detection of the instantiated components is easy because the abstraction tool 310 may simply match components in the circuit design against the known datapath components from the component library 360.

In one embodiment, the component library 360 contains the functional details for the desired datapath component, but not the abstraction for it. Accordingly, when a user instantiates a datapath component into the design, the datapath functionality but not the abstraction model is included in the design. After the design is passed to the formal verification system 300, the datapath abstraction tool 310 detects library components in the design and automatically replaces the datapath components with an abstraction model optimized for the formal verification system 300. The abstraction models for the detected datapath components may be obtained from an abstraction component library 330 that is internal to the formal verification system 300. In this way, the abstraction replacement is performed invisibly to the user, or "under the hood." In addition to simplifying the verification process for the user, making the abstraction models invisible to the user also enables the maker of the formal verification system 300 to protect the abstraction models from being accessed by others. These abstraction models may be valuable intellectual property, so this scheme helps to maintain these models as proprietary information.

Because library components are used, in one embodiment, the user needs only an understanding of the design and not of the formal verification or abstraction processes. The abstraction tool can thus accelerate formal verification engines without requiring the user to learn the technical details of formal verification or abstraction. Effectiveness and ease of use are thus enhanced by automating the application of the abstraction. Non-experts in formal verification can verify a design without learning algorithmic or abstraction techniques in formal verification. During the interaction with the tool, they are only given choices related to their designs, and not on choices about specific abstraction techniques. This allows the abstraction tool to be used by a wider range of professionals.

Once a datapath circuit is detected in a circuit design, the abstraction tool replaces the detected datapath circuit with a simpler abstraction model optimized for the functional formal verification process. Datapaths include a number of data signals and state-elements that have no functional significance to the property to be verified, so the resulting states that have no functional significance can be abstracted. Regardless of whether the user chooses to directly code the behavior of the datapath in the RTL description or whether the user chooses to instantiate a datapath component from a library of pre-coded components into their design or requirements model, the user does not have to understand the details of the datapath abstraction that are required for efficient functional formal verification. Once the datapath circuit has been detected, the tool automatically replaces the datapath circuit with an abstraction model of the datapath. This replacement technique is automatically performed in the functional formal verification tool and thus does not require modification to the user's original RTL description. In this way, an expert in datapath abstraction techniques or functional formal verification is no longer required, which overcomes one of the factors currently limiting the adoption of functional formal verification in an industrial setting.

Figure 4:
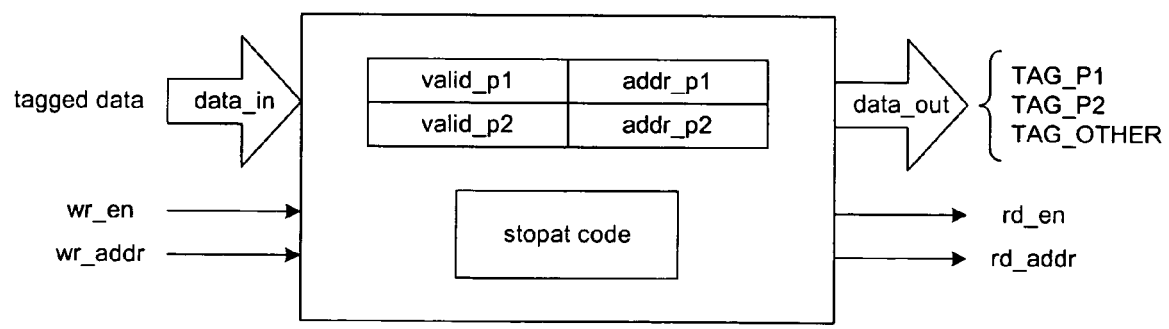
FIG. 4 shows an abstraction of a datapath circuit, in accordance with an embodiment of the invention.

FIG. 4 illustrates one embodiment for an abstraction of a datapath circuit that is designed to pass data through the datapath in a particular order, such as a FIFO or a LIFO element. This abstraction takes advantage of the observation that only three unique data item values are sufficient to verify that the design will not drop, duplicate, or corrupt any data items as they pass through the portion of the design containing the datapath circuit (that is, as the data pass from the input of the datapath element to the output of the datapath element). Furthermore, the abstraction takes advantage of the symmetry involved in the datapath circuits to reduce the width of a wide datapath circuit down to a very narrow width. In general, only a single bit is required to prove data integrity and correct ordering for message or packets of equal priority, as demonstrated by C. Stangier and U. Holtmann, "Applying Formal Verification with Protocol Compiler," Euromicro Symposium on Digital Systems Design, Architectures, Methods, and Tools, Warsaw, Poland, Sep. 4–6, 2001, which is incorporated by reference herein in its entirety. However, for designs where arriving messages or packets are assigned various priorities, additional bits may be required for the abstraction. For designs containing two priority levels for arriving messages or packets, for example, two bits are required for the abstraction to handle the two classes of priority.

In one example, two bits (i, j) are arbitrarily selected from a wide datapath circuit, resulting in a narrow two-bit width datapath. For example, consider an n-bit wide datapath:

wide_data [n−1, . . . , i, . . . , j, . . . , 0]

In this case, bits wide_data[i] and wide_data[j] are arbitrarily selected. Hence, the reduced data item is modeled as follows (using Verilog for this example):

narrow_data [1:0] = {wide_data[i], wide_data[j]}

The arbitrarily selected two bits from the n-bit wide data item are concatenated together to form a narrow two-bit data item. As previously stated, since only three data items are required to verify that the design will not drop, duplicate, or corrupt the data passing through it, the next step is to tag the narrow data as follows: TAG_P1, TAG_P2, and TAG_OTHER. In one example, this aging is encoded as follows: TAG_P1 =00, TAG_P2 = 01, and TAG_OTHER = 10. Other encodings of the reduced two-bit data item are possible.

The abstraction model illustrated in FIG. 4 contains two registers: addr_p1 and addr_p2. When a data item of value TAG_P1 is written into the abstract datapath circuit, the write address associated with the TAG_P1 data item is stored in the addr_p1 register. Similarly, when the data item of value TAG_P2 is written into the abstract datapath circuit, the write address associated with the TAG_P2 data item is stored in the addr_p2 register. When a data item of value TAG_OTHER is written into the abstract datapath circuit, no operation is performed.

When a read is performed on the abstract datapath circuit, the read address is first compared with the value stored in the addr_p1 register. If the read address matches the write address value stored in the addr_p1 register, then a TAG_P1 value is driven out (i.e., output) from the abstract datapath circuit. If the read address does not match the value stored in the addr_p1 register, then the read address is compared to the write address value stored in the addr_p2 register. If the comparison is successful, then a TAG_P2 value is driven out of the abstract datapath circuit. If the read address value does not match either the value contained in the addr_p1 or addr_p2 register, then a TAG_OTHER is driven out of the abstract datapath circuit.

In one embodiment, the abstraction shown in FIG. 4 is captured as a series of assumptions as well as the two registers used to store the address for written TAG_P1 and TAG_P2. The actual datapath description in the original code is ignored by the tool, while the abstraction is incorporated into the formal verification as a set of assumptions. This embodiment of the invention enables abstraction without direct manipulation of the RTL description. This abstraction can be introduced as an assumption in a formal verification tool. For the output of the memory from which data are sent out, the following assumptions can be used:

```
assume (rd_en && valid_p1 && rd_addr==addr_p1) => \
  (data_out == 'TAG_P1)
assume (rd_en && valid_p2 && rd_addr==addr_p2) => \
  (data_out == 'TAG_P2)
assume (rd_en &&
  (valid_p1 => (rd_addr !=addr_p1) && \
  (valid_p2 => (rd_addr !=addr_p2)) => \
    (data_out == 'TAG_OTHER)))
```

A similar set of assumptions can be created for the input side of the memory where the data are received.

This datapath abstraction permits the formal verification tool to prove the following class of properties: If a packet P2 is of higher or equal priority as a packet P1, then if P2 arrives before P1, then P2 must exit the design before P1. The priority of packet is encoded in the reduced two-bit narrow width datapath abstraction. If a design supports multiple priority levels, it can be proved that only three bits are required to encode the various priority levels. Similarly, for a design that supports only a single priority of input packets, only a single bit is required for the abstraction.

This abstraction eliminates the need to model a memory store or array of registers, thus reducing the number of states required to perform the formal verification proof on the circuit design. For example, a datapath of width 128 and depth 64 would require the formal tool in the worst case to represent $64*(2**128)$ states associated with the datapath component. For the abstraction model of narrow width 2 and two registers of width 6 (that is, it takes 6 bits to address all the elements in a datapath of depth 64), the reduced state presented to the formal verification tool would be 128 (or, $2*(2**6)$) states associated with the abstracted datapath component.

In one embodiment, the datapath abstraction tool is configured to use the identification of a datapath circuit to deduce additional datapath circuits, for which an abstraction can be applied. Deducing datapaths from known datapaths in a circuit design takes advantage of the observation that datapath elements commonly drive other datapath elements in a circuit. In such cases, the data entering a block in a design will often encounter a series of datapath elements before it exist the block.

Figure 5:
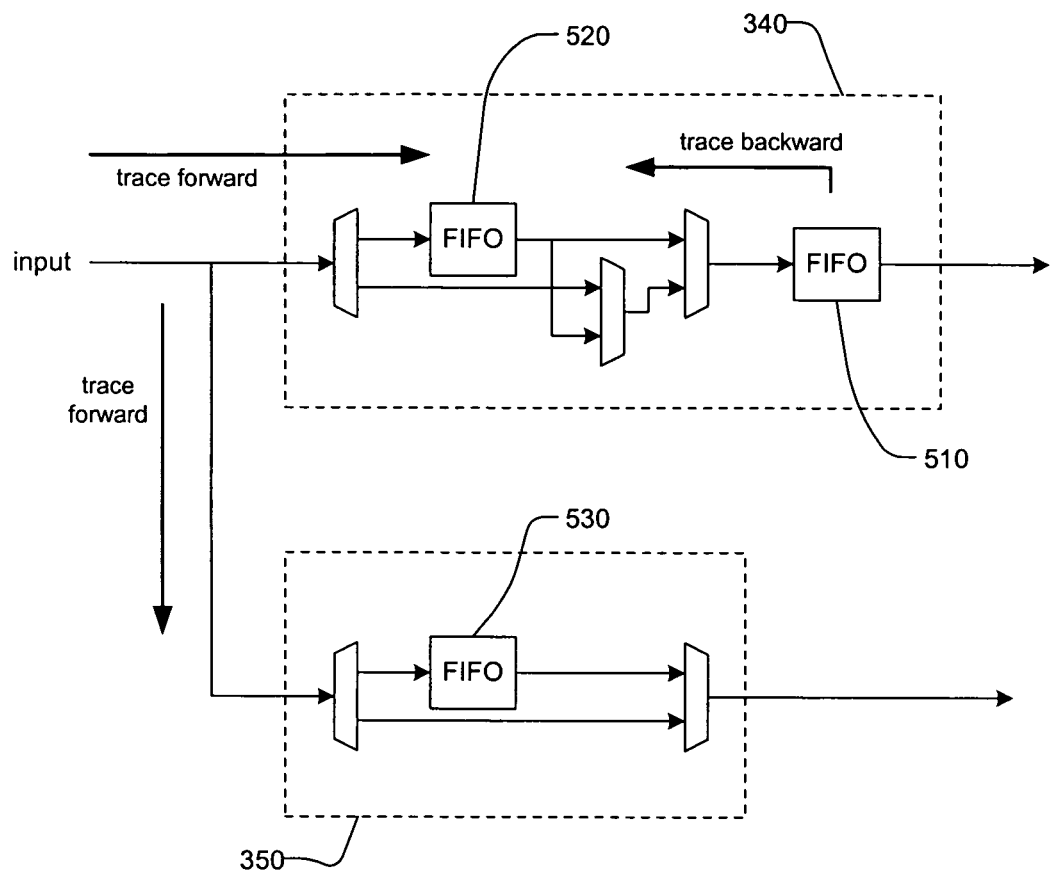
FIG. 5 shows a circuit design and requirements model for which additional datapath circuits are deduced based on an identified datapath in a circuit design, in accordance with an embodiment of the invention.

FIG. 5 illustrates an example of a digital circuit design 340 and an associated requirements model 350 that include a number of datapath elements, which can be abstracted before the formal verification phase. In one example of abstracting the design, the datapath abstraction tool detects the presence of the FIFO 510 in the circuit design 340. To deduce additional datapath elements, the abstraction tool traces the data signal backward from the input of the detected FIFO 510 towards the input of the design. As this tracing occurs, the path may branch, and the tool may follow one or more of the paths that are likely to contain datapath elements. In the example shown in FIG. 5, the tool will encounter the FIFO 520 as it traces backward towards the input.

As the tool traces backward in the design 340, it attempts to determine whether the encountered components are datapath elements that should be abstracted. To determine whether a component is a datapath element, the tool may use any of the techniques described above, including structural analysis, library component identification, user input, and any combination thereof. If the tool determines that a component is a datapath element that should be abstracted, the tool replaces that element with an appropriate abstraction or marks the element for abstraction later.

Once the tool reaches the input, the tool traces forward from the input, branching as necessary and as desired. In the example shown in FIG. 5, the tool traces forward into the requirements model 530 and will encounter FIFO 530. When this FIFO 530 is encountered, the tool determines that FIFO 530 is indeed a datapath element, and performs an appropriate abstraction on it as described above. Any other datapath elements in the circuit design 340 and in the requirements model 350 can likewise be identified and abstracted.

When tracing along a data signals, it is expected that the tool will generally encounter elements such as multiplexers, demultiplexers, buffers, inverters, and similar components. If the tool encounters other types of logic, such as logic that performs a transformation or computation on the traced signal, it is less likely that the traced path will lead to the types of datapath elements that can be abstracted in accordance with embodiments of the invention. Accordingly, in one embodiment, the tool halts tracing on a particular path if it encounters such logic or other types of components that indicate that the path probably does not contain datapath elements.

Although tracing backward and then forward is described, the tool may deduce additional abstractions by traversing any desired route in the circuit design and model. In various embodiments, one or more tracing routes may begin from an identified datapath element or data signal or from a location provided by the user. By deducing datapaths, the tool can reduce the set of possible candidates for datapath identification, which lessens the computational burdens on the tool. For example, while it may be relatively simple to identify a datapath element if the user instantiates one from a library of datapath models, identifying datapaths using the structural analysis detection scheme may be costly. Hence, once a datapath is identified, the work of identifying other datapath elements can be reducing using a tracing technique to deduce other datapaths, which is less costly.

Figure 6:
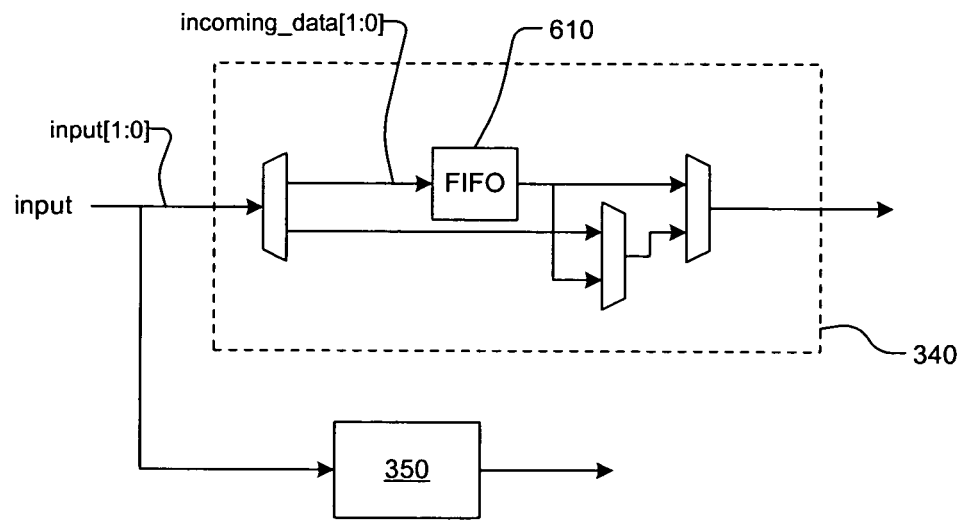
FIG. 6 shows a circuit design and requirements model for which abstractions of datapaths are linked in a circuit design, in accordance with an embodiment of the invention.

In another embodiment, the datapath abstraction tool is configured to link one or more identified abstracted datapath elements to an input of the circuit design 340. In the example shown in FIG. 6, a FIFO 610 has been detected in the circuit design 340. Taking an example to illustrate how the abstraction is linked, the FIFO 610 is abstracted with the following set of assumptions:

wire assume1 = ! tag_p1 || incoming_data[1:0] == 2 ' b01
wire assume2 = ! tag_p2 || incoming_data[1:0] == 2 ' b10
wire assume3 = tag_p1 || tagp2 || incoming_data[1:0] == 2 ' b00

These assumptions affect the inputs to the FIFO 610; however, the assumptions created for the FIFO 610 can be linked so that they also influence the input signal of the design block 340. In other words, the two bits that are set to the tagged value by the assumption will apply to the same two bits propagated through the design from the input. The signal received by the FIFO 610, incoming_data [1:0], is thus propagated back to the input of the circuit design 340, input[1:0]. As the signal is propagated backward, it is passed through various buffering elements, such as multiplexers and registers. Accordingly, the set of assumptions are rewritten in terms of the input signal, input[1:0], rather than the input to the FIFO 610, incoming_data[1:0]. In the example provided, the set of assumptions become:

wire assume1=! tag_p1 || input [1:0] ==2 ' b1;
wire assume2=! tag_p2 || input [1:0] ==2 ' b10;
wire assume3= tag_p1 || tag_p2 || input [1:0] ==2 ' b00

In this way, the abstraction modeled for the FIFO 610 is related to the input signal for the design so that, ultimately, the same two bits tagged at the FIFO 610 input will be set the same way at the input when the constraint is propagated backward.

As long as the incoming_data[1:0] signal from the datapath element need only be propagated through buffering elements that do not transform the data, propagating the signal back to the input is a simple task. Where the incoming_data[1:0] signal is propagated through flops or similar components in the circuit, sequential analysis may be needed to perform the propagation. In one embodiment, however, if propagating the signal would require passing through data transforming elements, there is no need to propagate the abstraction backward because the datapath is not likely to be of the type abstracted in accordance with an embodiment of the invention. Accordingly, if the tool encounters such elements in the path, the tool does not perform linking of the abstraction.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

We claim:

1. A computer-implemented method for performing formal verification of a circuit design that includes a plurality of datapath elements, the method comprising:
   detecting a first datapath element in a circuit design, wherein detecting the first datapath element comprises matching a portion of the circuit design including one or more datapath elements with a datapath element in a component library;
   replacing the first datapath element in the circuit design with a first abstraction the first abstraction applying a constraint relating an incoming signal of the first datapath element to an output of the first data path element;
   locating a second datapath element in the circuit design by tracing a data signal of the detected first datapath element through the circuit design to the second datapath element;
   replacing the second datapath element in the circuit design with a second abstraction the second abstraction applying a constraint relating an incoming signal of the second datapath element to an output of the second data path element; and
   passing the abstracted circuit design to a formal verification system, the abstracted circuit design including the first and second abstractions.

2. The method of claim 1, wherein detecting the first datapath element comprises:
   structurally analyzing the portion of the circuit design.

3. The method of claim 2, wherein structurally analyzing a portion of the circuit design comprises:
   locating a multiplexer component in the circuit design, the multiplexer component having a control signal, a set of inputs, and an output;
   forming a set of equations that relate the control signal of the multiplexer component to the output of the multiplexer component; and
   determining the existence of a datapath element based on whether the equations are mutually exclusive.

4. The method of claim 1, wherein replacing the first datapath element comprises:
   locating the first abstraction from an abstraction library; and
   applying the first abstraction to the circuit design.

5. The method of claim 1, wherein replacing the first datapath element is performed within a formal verification system so that the first abstraction is not visible to a user.

6. The method of claim 1, wherein the first and second datapath elements are FIFO modules.

7. A computer-implemented method for managing formal verification complexity of a circuit design that has a plurality of datapath elements, the method comprising:
   identifying a datapath element in a circuit design by matching a portion of the circuit design including one or more datapath elements with a datapath element in a component library;
   a step for deducing additional datapath elements by tracing data signals from known datapath elements to the deduced additional datapath elements;
   a step for abstracting at least some of the datapath elements in the circuit design with one or more abstractions, wherein an abstraction applies a constraint relating an incoming signal of a datapath element to an output of a path element; and
   performing formal verification on the abstracted circuit design,
   wherein the datapath elements are FIFO modules.

8. A computer program product for performing formal verification of a circuit design that includes a plurality of datapath elements, the computer program product comprising a computer-readable medium containing computer program code for being executed by a processor to perform the operations:
   detecting a first datapath element in a circuit design, wherein detecting the first datapath element comprises matching a portion of the circuit design including one or more datapath elements with a datapath element in a component library;
   replacing the first datapath element in the circuit design with a first abstraction the first abstraction applying a constraint relating an incoming signal of the first datapath element to an output of the first data path element;
   locating a second datapath element in the circuit design by tracing a data signal of the detected first datapath element through the circuit design to the second datapath element;
   replacing the second datapath element in the circuit design with a second abstraction the second abstraction applying a constraint relating an incoming signal of the second datapath element to an output of the second data path element; and
   passing the abstracted circuit design to a formal verification system, the abstracted circuit design including the first and second abstractions.

9. The computer program product of claim 8, wherein detecting the first datapath comprises:
   structurally analyzing a portion of the circuit design.

10. The computer program product of claim 9, wherein structurally analyzing a portion of the circuit design comprises:
    locating a multiplexer component in the circuit design, the multiplexer component having a control signal, a set of inputs, and an output;
    forming a set of equations that relate the control signal of the multiplexer component to the output of the multiplexer component; and
    determining the existence of a datapath element based on whether the equations are mutually exclusive.

11. The computer program product of claim 8, wherein replacing the first datapath element comprises:
    locating the first abstraction from an abstraction library; and
    applying the first abstraction to the circuit design.

12. The computer program product of claim 8, wherein replacing the first datapath element is performed within a formal verification system so that the first abstraction is not visible to a user.

13. The computer program product of claim 8, wherein the first and second datapath elements are FIFO modules.

14. A computer-implemented method for performing formal verification of a circuit design that includes a plurality of datapath elements, the method comprising:
- detecting a first datapath element in a circuit design, wherein detecting the first datapath element comprises matching a portion of the circuit design including one or more datapath elements with a datapath element in a component library, and wherein the first datapath element is a FIFO module;
- replacing the first datapath element in the circuit design with a first abstraction the first abstraction applying a constraint relating an incoming signal of the first datapath element to an output of the first data path element;
- locating a second datapath element in the circuit design by tracing a data signal of the detected first datapath element through the circuit design to the second datapath element, and wherein the second datapath element is a FIFO module;
- replacing the second datapath element in the circuit design with a second abstraction the second abstraction applying a constraint relating an incoming signal of the second datapath element to an output of the second data path element; and
- passing the abstracted circuit design to a formal verification system, the abstracted circuit design including the first and second abstractions.

15. A computer program product for performing formal verification of a circuit design that includes a plurality of datapath elements, the computer program product comprising a computer-readable medium containing computer program code for being executed by a processor to perform the operations:
- detecting a first datapath element in a circuit design, wherein detecting the first datapath element comprises matching a portion of the circuit design including one or more datapath elements with a datapath element in a component library, and wherein the first datapath element is a FIFO module;
- replacing the first datapath element in the circuit design with a first abstraction the first abstraction applying a constraint relating an incoming signal of the first datapath element to an output of the first data path element;
- locating a second datapath element in the circuit design by tracing a data signal of the detected first datapath element through the circuit design to the second datapath element, and wherein the second datapath element is a FIFO module;
- replacing the second datapath element in the circuit design with a second abstraction the second abstraction applying a constraint relating an incoming signal of the second datapath element to an output of the second data path element; and
- passing the abstracted circuit design to a formal verification system, the abstracted circuit design including the first and second abstractions.

* * * * *

UNITED STATES PATENT AND TRADEMARK OFFICE
CERTIFICATE OF CORRECTION

| | |
|---|---|
| PATENT NO. | : 7,237,208 B1 |
| APPLICATION NO. | : 10/818711 |
| DATED | : June 26, 2007 |
| INVENTOR(S) | : Chung-Wah Norris Ip et al. |

It is certified that error appears in the above-identified patent and that said Letters Patent is hereby corrected as shown below:

On the Title page, Item (57), line 9 of the Abstract, please change "simplifying" to --simplify--.

Signed and Sealed this

Twenty-eighth Day of August, 2007

JON W. DUDAS
*Director of the United States Patent and Trademark Office*